(12) United States Patent
Robinson (10) Patent No.: US 7,129,778 B2
(45) Date of Patent: Oct. 31, 2006

(54) DIGITAL CROSS CANCELLATION SYSTEM

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 20 days.

(21) Appl. No.: 10/625,378

(22) Filed: Jul. 23, 2003

(65) Prior Publication Data

US 2005/0017802 A1    Jan. 27, 2005

(51) Int. Cl.
*H03F 1/00* (2006.01)

(52) U.S. Cl. ................................. 330/151; 330/149

(58) Field of Classification Search ............ 330/151, 330/149; 375/297; 455/63
See application file for complete search history.

(56) References Cited

U.S. PATENT DOCUMENTS

| | | | |
|---|---|---|---|
| 5,586,181 A * | 12/1996 | Kiko | 379/399.01 |
| 5,963,091 A * | 10/1999 | Chen et al. | 330/151 |
| 6,188,732 B1 * | 2/2001 | Rha | 375/297 |
| 6,392,483 B1 | 5/2002 | Suzuki et al. | |
| 6,774,834 B1 * | 8/2004 | Dartois | 341/144 |
| 6,885,242 B1 * | 4/2005 | Leffel et al. | 330/149 |
| 6,885,709 B1 | 4/2005 | Dartois | |
| 6,934,341 B1 * | 8/2005 | Sahlman | 375/297 |
| 2005/0012550 A1 | 1/2005 | Posner et al. | |

* cited by examiner

*Primary Examiner*—Henry Choe
(74) *Attorney, Agent, or Firm*—Tarolli, Sundheim, Covell&Tummino LLP (57) ABSTRACT

An amplification system and method is provided that employs a digital cross-cancellation technique which provides a separate digital signal to be input to a separate DAC to generate a cancellation signal. The cancellation signal is added to the output of the amplifier to produce a final signal with substantially reduced distortion and/or out-of-band emissions. The cancellation signal can be pre-computed or derived by generating an inverted version of the wanted signal, and combining it with a portion of the output signal to determine the error or unwanted portion of the output signal. This error signal is then combined with a delayed version of the output signal.

28 Claims, 7 Drawing Sheets

DIGITAL CROSS CANCELLATION SYSTEM

CROSS REFERENCE TO RELATED APPLICATIONS

The present application is related to New Robinson U.S. patent application entitled "System and Method for Reducing Dynamic Range and Improving Linearity in an Amplification System", Filed Jul. 23, 2003, Ser. No. 10/625,367, assigned to the same assignee as the present application.

TECHNICAL FIELD

The present invention relates generally to electronic devices, and more particularly to a linearization system and method for power amplification systems.

BACKGROUND OF THE INVENTION

RF power amplifiers used for wireless communication transmitters, with spectrally efficient modulation formats, require high linearity to preserve modulation accuracy and to limit spectral regrowth. Typically, a linear amplifier, Class-A type, Class-AB type or Class-B is employed to faithfully reproduce inputs signals and to limit the amplifier output within a strict emissions mask. Linear amplifiers are capable of electrical (DC power in to RF power out or DC-RF) efficiencies of 50% or more when operated at saturation. However, they are generally not operated at high efficiency due to the need to provide high linearity. For constant envelope waveforms, linear amplifiers are often operated below saturation to provide for operation in their linear regime. Time varying envelopes present an additional challenge. The general solution is to amplify the peaks of the waveform near saturation, resulting in the average power of the waveform being amplified at a level well backed-off from saturation. The back-off level, also referred to as output power back-off (OPBO), determines the electrical efficiency of a linear amplifier.

For example, the efficiency of a Class-A type amplifier decreases with output power relative to its peak value (EFF=$P_{OUT}/P_{PEAK}$). The efficiency of Class-B type amplifiers also decreases with output power relative to its peak value (EFF=$(P_{OUT}/P_{PEAK})^{1/2}$). Class-AB type amplifiers have output power variations intermediate between these values. Thus, there is customarily an inherent tradeoff between linearity and efficiency in amplifier designs.

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band (OOB) emissions from occurring into adjacent channels but produces time-varying envelopes. In addition to amplifying individual waveforms with time varying envelopes, many transmitters (especially in base stations) are being configured to amplify multiple carriers. Multi-carrier signals have a wide distribution of power levels resulting in a large peak-to-average ratio (PAR). Therefore, the operation of the linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and applications growing in use. Each requires amplification of a waveform with high PAR levels, above 10 dB in some cases. The sparse amount of spectrum allocated to terrestrial wireless communication requires that transmissions minimize OOB emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its—peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacture and operation.

One of the techniques used in the design of highly linear amplifiers is known as the feedforward (FF) technique. FF amplifier systems are based on a two-loop analog system design. Typically, the first loop splits off a sample of the analog amplifier input as a reference and compares it to a sample of the amplifier output to produce an error signal. The error primarily consists of the signal produced by non-linear amplification in the power amplifier. The second loop subtracts the error signal from a delayed version of the power amplifier output. FF is effective in reducing OOB emissions and to some repairing errors to the wanted signal. The technique requires careful control of the amplitude and phase of each signal, which impacts the maximum bandwidth over which a level of correction can be applied. A range of techniques exists to control amplitude and phase over temperature variations. If there is any corruption of the reference then the performance of the FF system degrades. Ideally, the FF technique reduces the amplifier distortion level to that of the input. The amplifier input is generally already distorted somewhat from non-linearities or clipping effects earlier in the amplifier signal chain (e.g., DAC, mixers, and/or driver amplifiers.)

Feed forward techniques have several limitations. They cannot be employed in amplification systems that decompose an input signal into multiple components (e.g., polar amplifier, LINC amplifier), since a single input signal is not available as a reference. If the input signal the amplifier is highly distorted, for example due to an element that clips the peak of the signal, then FF will not significantly reduce overall distortion. It is not possible to combine digital pre-distortion with feedforward as the reference signal will contain the amplitude and phase changes as a result of the pre-distortion, and these changes will be contained in the error signal and re-introduced to the signal at the amplifier output.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an amplification system and method that employs a digital cross-cancellation (DCC) technique which provides digital reference signals to one or more separate signal paths from the main amplifier. The one or more separate signal paths include respective digital-to-analog converters (DACs) for each path, to generate signals that are ultimately coupled together with the output of the main amplifier. These separate signals serve multiple useful functions including providing a minimally distorted reference for cancellation of out-of-band (OOB) emissions and correction of wanted signal distortion, as well as addition or subtraction of other signals to the final amplifier output.

The DCC technique can either pre-compute corrective signals for reducing OOB emissions and wanted signal distortion or it can electronically derive corrective signals by generating a digital, undistorted reference copy of the wanted signal which is converted to analog and compared to a sample of the amplifier output. The DCC can take advantage of these separate signal paths to modify the wanted signals prior to input to the main amplifier and prior to being converted from digital to analog signals. Modification can include reducing peak signal levels through clipping and/or the addition of signals, as well as pre-distortion of amplitude and phase terms to counter expected distortion.

The separate signal paths can convey computed or predicted signals to correct wanted signal distortion and/or OOB emissions in a single channel or in channelized spectral bands. The separate signal(s) can also be used to generate one or more reference signals that are added to sample(s) of the main amplifier output to empirically determine an error signal in one or more spectral bands. The error signal(s) can be phase inverted, appropriately amplitude scaled then coupled with either the amplifier output or a delayed version of the main amplifier output.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to an amplification system and method that employs a digital cross-cancellation technique. The digital cross-cancellation technique supplies one or more separate reference signals to be combined with the output of the main amplifier prior to transmission. The separate reference signals enable reduced peak signal levels, correct distortion from the main amplifier signal chain, and cancel significant portions of OOB emissions. Cancellation of OOB emissions can be accomplished by predicting and/or supplying the appropriate signals to the separate path, or by generating an undistorted or "clean" version of the wanted signal from which the error or unwanted signals are electronically derived.

Signal distortion and OOB emissions result from a number of sources including non-linearity in amplifiers, DACs, as well as from limiting or clipping of signals. When considering systems that split wanted signals into two or more components, such as polar amplifiers or LINC amplifiers, additional errors can result from imperfect synchronization of signals amplified along separate paths and/or due to limitations in the bandwidth of a path. Two methods for determining transmitter distortion are to pre-compute the errors based on transmitter and signal models, or to derive the error by comparing the final amplifier output with a reference signal. In the former case an "anti-distortion" signal can be created and combined with the signal chain prior to transmission. In the latter case, the difference in these two signals can be phase inverted, amplified, and combined with a delayed version of the final amplifier output signal.

The present invention provides a technique for reducing signal distortion and suppressing OOB emissions for multi-component amplifiers that cannot be provided with feedforward systems. In conventional feedforward systems, there is not a single reference signal from which to derive the error signal. The present invention provides improved OOB emission cancellation and wanted signal correction over conventional FF systems, as the reference signal in the present invention can be created with fewer distortions.

One or more parallel paths can be provided to the main amplifier chain that each generate a cancellation signal, spanning all or a portion of the band to be transmitted, that is combined with the final amplifier output. Each cancellation signal is generated by a distinct digital-to-analog converter (DAC) and may be amplified with distinct amplifiers.

At least one of the cancellation signals can contain a reference version of the wanted signal that is compared to the final amplifier output. The difference in this comparison is used to generate a cancellation signal that may be inverted, amplified, and combined with a delayed version of the final amplifier. The cancellation signal also contains, optionally, digitally computed post-correction terms and signal cancellation components to remove any signals purposefully added to the wanted signals that the system should not broadcast. Added signals could include signals to cancel peak reduction signals or calibration signals that have been introduced into the main signal path. The present invention combines techniques to reduce out-of band emissions (OOB) and wanted signal distortion due to amplifier non-linearity and reduces wanted signal peak-to-average ratio (PAR) enabling the use of smaller, lower cost amplifiers and higher efficiency architectures.

Clipping the input signal generally results in unwanted OOB emissions and/or errors in the wanted signal. The DCC technique can remove the OOB emissions and add in a correction signal to reduce or remove errors in the wanted signal. The OOB emissions and wanted signal errors can be computed in advance or determined empirically as mentioned above. Another technique to reduce peak signals that avoids most of the OOB emission problem is to add or remove components to reduce peaks. The compromise in other systems is these added or deleted signals will be part of the transmitted waveform, unless they are filtered somewhere along the signal chain. The DCC technique can correct these additional signals after main amplification before transmission.

Reducing signal peak saves amplifier size and for linear amplifiers improves DC-RF efficiency. Therefore, smaller (less power capacity) and less costly power amplifiers can be employed to achieve similar performance and improved amplifier system efficiency as compared to amplifier systems with much larger less efficient power amplifiers. The use of one or more delta-sigma DACs reduces the number of components in each path, simplifying synchronization of the main signal path with the one or more separate signal paths.

Figure 1:
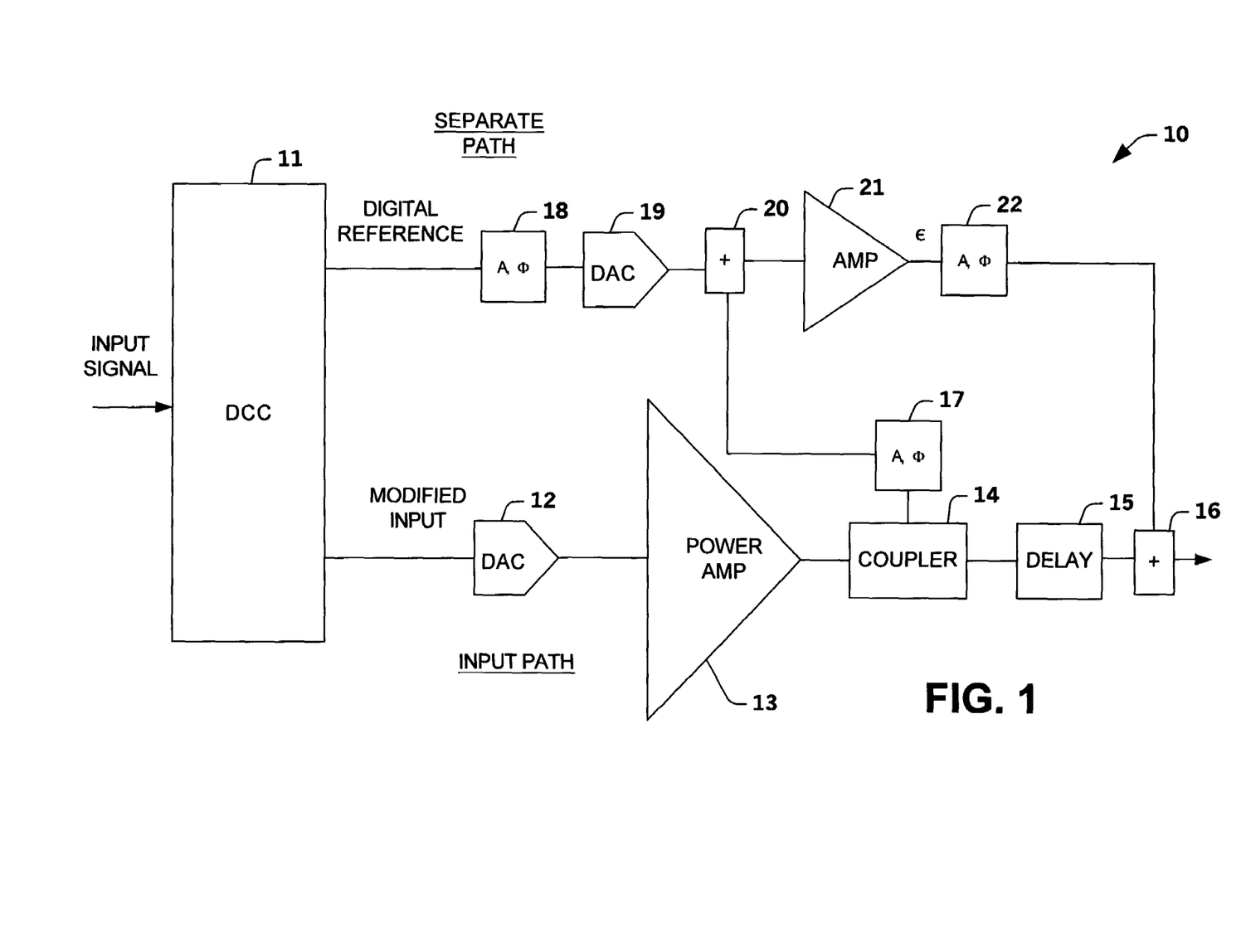
FIG. 1 illustrates a schematic block diagram of an amplification system in accordance with an aspect of the present invention.

FIG. 1 illustrates an amplification system 10 in accordance with an aspect of the present invention. The amplification system 10 includes a digital cross cancellation component (DCC) 11 that receives an input signal and generates a modified input signal and a separate digital copy of the wanted signal from which to produce a reference signal. The modified input signal can be clipped by a clipping filter or the like to remove large peaks from the input signal. The modified signal can also be predistorted by a predistortion component to mitigate losses and OOB emissions caused by the clipping. Additional signals (e.g., anti-peaking signals, anti-distortion signals) or a peak limiting shaping algorithm can be performed on the input signal to provide the modified signal. The above modifications can be performed individually, in combination or with other modification techniques to produce a modified signal that is optimal with respect to amplifier linearity, efficiency and power consumption.

The modified input signal is transmitted to a digital to analog converter (DAC) 12. The DAC 12 converts the modified digital input signal from the digital domain to the analog domain. The DAC can be a delta sigma modulated DAC (e.g., 1-bit DAC) to perform a digital-to-analog conversion directly to radio transmission frequencies. A one-bit converter provides analog conversion with extremely high linearity (low distortion). The output of the DAC 12 is then provided to the input terminal of a power amplifier 13 for amplification. The power amplifier 13 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions. With the input signal appropriately split into components, the power amplifier can be a components-based amplifier such as polar, LINC, or other known components-based amplifiers. The digital cross-cancellation component 11 provides a digital reference signal along a separate path to a digital phase inverter 18. The reference signal (REF) is an undistorted signal corresponding to the desired amplified output signal prior to any modifications. Alternatively, the digital phase inverter 18 can be eliminated and the inverted version of the reference signal can be provided by the digital cross-cancellation component 11. The inverted reference signal is transmitted to a second DAC 19. The second DAC 19 can also be a delta sigma modulated DAC to perform a digital-to-analog conversion directly to radio transmission frequencies of the inverted version of the clean reference signal (REF).

A small portion of the power amplifier output is split off through a coupler 14. The coupler 14 provides an attenuated version of the power amplifier output to an amplitude and phase control component 17. The amplitude and phase control component 17 provides the attenuated signal to a summer 20. The attenuated signal is then summed with the inverted reference signal via the summer 20. The output of the summer 20 is almost entirely signal distortion and OOB emissions. The output of the summer 20 is amplified by an error or cancellation amplifier 21 to produce an error signal ($\epsilon$). The cancellation amplifier 21 should be substantially linear to provide the correct signal to cancel distortion. For example, a class A or A/B amplifier that is well backed-off can be employed. Additional linearization of the cancellation amplifier 21 can be employed, including a pre-distortion system (analog or digital; the latter requiring digitizing and re-converting the signal), a feedforward loop or some other linearization technique. The size of the cancellation amplifier 21 is dependent on the required correction level (i.e., OOB emissions, signal distortions). Therefore, pre-distortion of the main signal path can be combined with the digital cross-cancellation technique to reduce the size of the cancellation amplifier 21.

Employing pre-distortion reduces the remaining distortion so that components that are smaller, less costly and consume less power can be employed. Pre-distortion is readily combinable with the digital cross-cancellation technique, which is not true for conventional feedforward techniques since the pre-distortion adjustment of wanted signal amplitude and/or phase would effect the reference signal in a conventional feedforward system.

The error signal is inverted through an analog phase inverter 22 to provide an inverted error signal. The inverted error signal is recombined with a delayed version of the output of the power amplifier 13 via a delay component 15. The delay component 15 can be a cable, monolithic block, wrapped balun or transmission line to provide a small delay (e.g., nanoseconds). The inverted error signal and the delayed version of the output of the power amplifier 13 are combined through a summer 16 to remove OOB emissions and reduce distortion levels. Feedback to the DCC block to tune amplitude and phase variations can be optionally included.

The digital cross-cancellation technique in accordance with an aspect of the present invention can supply correction for amplifier distortions and it can correct spectral splatter that occurs from intentional clipping of the wanted signals performed to allow for amplifier size reduction. Additionally, since a digital reference signal is employed to determine the desired correction at the output, any modification of the signal can be corrected at the final output stage without the need for additional correction information during the amplification process. The digital cross cancellation component 11 can be a digital component, such as an application specific integrated circuit (ASIC), field programmable gate array (FPGA), a digital signal processor (DSP) or a combination of digital hardware and/or software components.

In one aspect of the invention, one or both of the first DAC 12 and the second DAC 19 are delta sigma modulated DACs. Delta Sigma modulation is a technique used to generate a coarse estimate of a signal using a small number of quantization levels and a very high sampling rate. The small number (two for a one-bit quantizer) of discrete levels introduces "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta sigma DACs can be employed to upconvert the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range). If higher frequency operation is desired there the DCC technique will operate successfully if frequency conversion apparatus is used in any or all of the signal paths.

The digital cross cancellation technique can be applied at any amplifier stage before the final amplifier as well. Employing it at a point between the DAC output and the final amplifier input would allow any artifacts from a parallel implementation of the delta-sigma DAC to be removed. As long as the artifact is smaller than the wanted signal, the DAC in the cancellation path requires substantially less dynamic range than the main path and can provide a usable reference with non-iterative DACs or a single stage delta-sigma DAC.

In the case of WCDMA, digital cross cancellation technique signal simulations have shown that aggressive clipping (up to 5 dB reduction in peak signal) will distort the wanted signal a small amount but will cause OOB emissions up to 20 dB. The digital cross-cancellation technique of the present invention can correct as much as 30 dB of distortion over terrestrial wireless bandwidths with obtainable phase and amplitude control.

Figure 2:
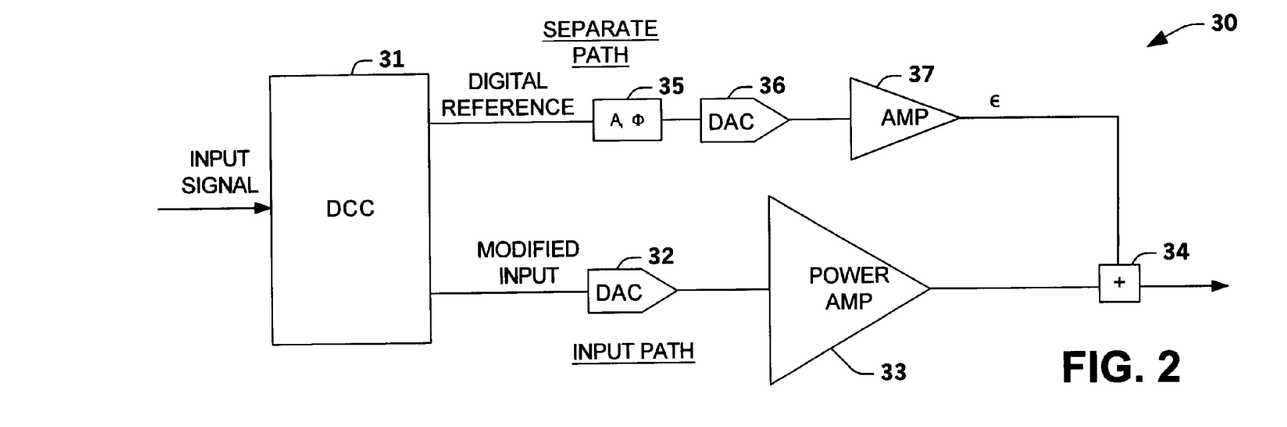
FIG. 2 illustrates a schematic block diagram of an amplification system in accordance with another aspect of the present invention.

FIG. 2 illustrates an amplification system 30 in accordance with another aspect of the present invention. The amplification system 30 includes a digital cross cancellation component (DCC) 31 that receives an input signal and generates a modified input signal and a correction or an anti-distortion signal (digital reference). The modified input signal can be clipped by a clipping filter or the like to remove large peaks from the input signal. The modified signal can also be predistorted by a predistortion component to mitigate losses and OOB emissions caused by the clipping. Additional signals (e.g., anti-peaking signals, anti-distortion signals) or a peak limiting shaping algorithm can be performed on the input signal to provide the modified signal. The above modifications can be performed individually, in combination or with other modification techniques to produce a modified signal that is optimal with respect to amplifier linearity, efficiency and power consumption.

The modified input signal is transmitted to a digital to analog converter (DAC) 32. The DAC 32 converts the modified digital input signal from the digital domain to the analog domain. The DAC 32 can be a delta sigma modulated DAC (e.g., 1-bit DAC) to perform a digital-to-analog conversion directly to radio transmission frequencies. A one-bit converter provides analog conversion with extremely high linearity (low distortion). The output of the DAC 32 is then provided to the input terminal of a power amplifier 33 for amplification. The power amplifier 33 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions. With the input signal appropriately split into components, the power amplifier can be a components-based amplifier such as polar, LINC, or other known components-based amplifiers.

The digital cross-cancellation component 31 provides a digital reference signal along a separate path to a digital phase inverter 35 which can also control signal amplitude. The reference signal (REF) is an anti-distortion signal that removes errors and OOB emissions introduced to the wanted signal as a result of the modifications. Alternatively, the digital phase inverter 35 can be eliminated and the inverted version of the reference signal can be provided by the digital cross-cancellation component 31. The inverted reference signal is transmitted to a second DAC 36. The second DAC 36 can also be a delta sigma modulated DAC to perform a digital-to-analog conversion directly to radio transmission frequencies of the inverted version of the clean reference signal (REF). The present invention enables substantially aggressive clipping to be applied. Simulation results of a multi-carrier WCDMA class A/B amplifier showed OOB emissions and error vector magnitude (EVM) requirements could be met, while reducing PAR to 5 dB or less.

The output of the DAC 36 is amplified by an error or cancellation amplifier 37 to produce an error signal ($\epsilon$). The cancellation amplifier 36 should be substantially linear to provide the correct signal to cancel distortion. For example, a class A or A/B amplifier that is well backed-off can be employed. Additional linearization may be applied to the cancellation amplifier 37 including a pre-distortion system (analog or digital; the latter requiring digitizing and re-converting the signal), a feedforward loop or some other linearization technique. The size of the cancellation amplifier 37 is dependent on the required correction level (i.e., OOB emissions, signal distortions). Therefore, pre-distortion of the main signal path can be combined with the digital cross-cancellation technique to reduce the size of the cancellation amplifier 37. The error signal output of the power amplifier 33 are combined through a summer 34 to remove OOB emissions and reduce distortion levels associated with modification of the input signal. Feedback to the DCC component 31 to tune amplitude and phase variations can be optionally included.

Figure 3:
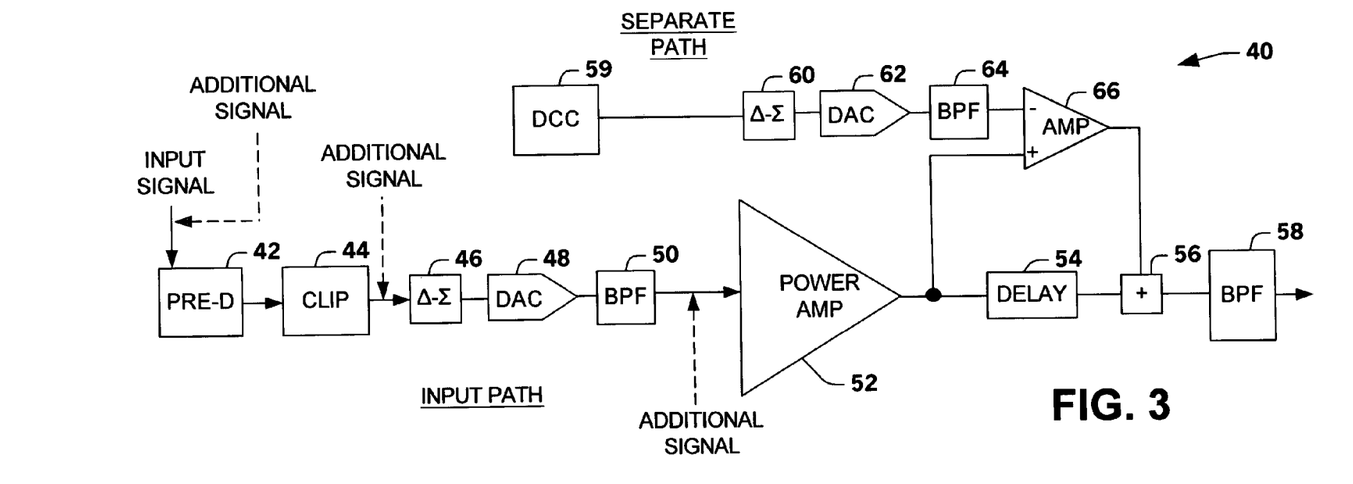
FIG. 3 illustrates a schematic block diagram of an amplification system in accordance with yet another aspect of the present invention.

FIG. 3 illustrates an amplification system 40 in accordance with another aspect of the present invention. The amplification system 40 employs one or more techniques to modify an input signal to facilitate the linear operation and to improve the efficient operation of a power amplifier. These modifications are then corrected employing digital cross-cancellation techniques that utilize a reference version of a wanted signal to correct the final output of the amplification system 40. If signals are added to the main signal path of the power amplifier for peak reduction, calibration, or other desired purposed then "anti-signals" are included in the separate signal path as to remove the added signals before transmission.

In the amplification system 40, an input signal is provided to pre-distortion component 42 that modifies the signals to reduce anticipated distortion in the amplifier chain. Determination of the initial pre-distortion gain and phase terms is typically performed off-line. The pre-distortion techniques of the present invention are employed in the digital domain, such that the digital input signal is modified prior to digital-to-analog conversion. Digital pre-distortion can be combined with digital cross-cancellation. This combination reduces some of the component sizes and complexities in the cross-cancellation loops.

The digital output signal from the pre-distortion component 42 is transmitted to a clipping filter 44. The clipping filter 44 removes large peaks associated with the input signal. The clipping filter 44 can perform a peak-to-average reduction by employing one or more techniques (e.g., peak limiting shaping algorithm). The clipped signal is then provided to a delta-sigma modulator 46 that is coupled to a DAC 48 and a band pass filter 50. It is to be appreciated that the system 40 can provide linearization to the amplifier 52 without the use of the clipping filter 44. The delta-sigma modulator 46, the DAC 48 and the band pass filter 50 cooperate to perform a digital-to-analog conversion directly to radio transmission frequencies. The DAC 48 can be a multi-bit converter or a one-bit converter that provides analog conversion with extremely high linearity (low distortion). The output of the band pass filter 50 is then provided to the input terminal of the power amplifier 52 for amplification. The power amplifier 52 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions.

An inverted clean reference signal (digital reference) is provided along a reference path. The inverted clean reference signal is provided by a digital cross-cancellation component 59. The inverted clean reference signal is an inverted reference version of the wanted signal corresponding to the desired amplified output signal prior to any modifications. The inverted clean reference signal is transmitted to a delta-sigma modulator 60. The delta sigma modulator 60 is coupled to a DAC 62 and a band pass filter 64. The delta-sigma modulator 60, the DAC 62 and the band pass filter 64 cooperate to perform a digital-to-analog conversion of the inverted clean reference signal directly to radio transmission frequencies. The DAC 62 can be a multi-bit converter or a one-bit converter that provides analog conversion with extremely high linearity (low distortion). The output of the band pass filter 64 is then provided to a negative input terminal of an inverting amplifier 66 set to generate an analog error signal that corresponds to an amplified error correction signal associated with the modification to the desired output signal.

A small portion of the power amplifier output is split off through an attenuator (not shown) and provided to a positive terminal of the inverting amplifier 66. The output of the inverting amplifier 66 is an inverted version associated with signal distortion and OOB emissions. The output of inverting amplifier 66 is recombined with a delayed version of the output of the power amplifier 52 via a delay component 54. The inverted error signal and the delayed version of the output of the power amplifier 52 are combined through a summer 56 to remove OOB emissions and reduce distortion levels. The output of the summer 56 is then provided to an optional band pass filter 58 which filters out any remaining unwanted signals outside the desired transmission band. It is to be appreciated that various component can be employed to combine an inverted error signal with a delayed version of the power amplifier output to correct for OOB emissions and unwanted distortion. Those skilled in the art will recognize that there are alternate methods to inverting amplifier 66 to produce the error signal.

Alternatively, a cancellation or "anti-distortion" signal can be computed and sent down the separate path to cancel the distortion before transmission. This is essentially an alternative to pre-distortion but has the benefit of not being constrained by the bandwidth of the high dynamic range DAC(s) that supports the main signal chain and power amp 52. The dynamic range of the reference path DAC 62 only needs to be larger than the distortion levels in the input signal. In this case, the delay element 54 is optional as is the splitting off of the amplifier output and connection to the positive input terminal of the amplifier 66. Feedback to the DCC component 59 to tune amplitude and phase variations can be optionally included.

Figure 4:
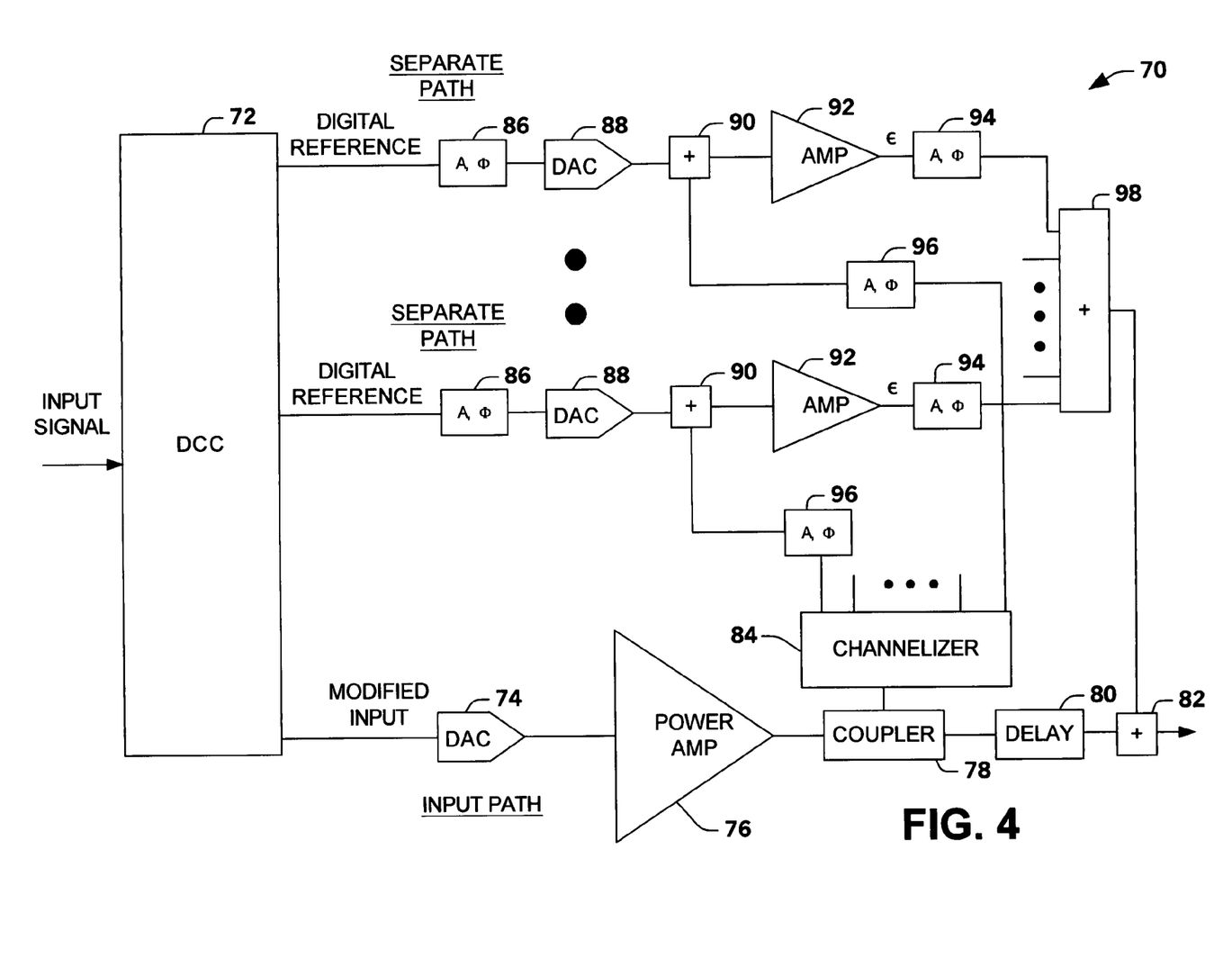
FIG. 4 illustrates a schematic block diagram amplification system with subband reference signals in accordance with an aspect of the present invention.

It is to be appreciated that multiple correction paths, subdividing the spectral band of interest can be used employing the digital cross-cancellation technique to more effectively provide correction over a wide bandwidth. FIG. 4 illustrates an amplification system 70 with subband reference signals in accordance with an aspect of the present invention. The amplification system 70 includes a digital cross cancellation component 72 that generates a modified input signal and a plurality of digital reference signals along a plurality of separate paths. The plurality of digital reference signals correspond to a plurality of subbands of a reference signal to provide separate corrections for the subbands of the modified input signal.

The digital cross cancellation component 72 provides the modified input signal along the input path. The modified input signal is modified based on particular characteristics associated with the input signal. This modification can include at least one of peak reduction or clipping, pre-distortion, and the adding of additional signals. Furthermore, these modifications can be employed to improve the linearization and efficiency the amplification system 70. The modified input signal is transmitted from the digital cross cancellation component 72 to a DAC 74. The DAC 74 converts the modified input signal from the digital domain to the analog domain. The DAC 74 can be a delta sigma modulated DAC to perform a digital-to-analog conversion directly to radio transmission frequencies. The output of the DAC 74 is then provided to the input terminal of the power amplifier 76 for amplification.

The digital cross-cancellation component 72 provides a plurality of subband references signals. Each subband reference signal has a separate path. Each separate path provides a corresponding subband reference signal to a digital phase inverter 86. The subband reference signal is a reference version (REF) of a subband associated with the input signal corresponding to the desired amplified subband prior to any modifications. The inverted subband reference signal is transmitted to a DAC 88. The DAC 88 can also be a delta sigma modulated DAC to perform a digital-to-analog conversion directly to radio transmission frequencies of the inverted version of the clean subband reference signal (REF).

A small portion of the power amplifier output is split off through a coupler 78 and provided to a channelizer 84. The channelizer 84 provides a plurality of subband signals in the same subbands as are provided in the separate paths. Each of the plurality of subband signals are provided to a corresponding phase and control component 96. The output of the control and phase component 96 is then provided to a summer 90. The summer 90 combines the associated subband amplifier output signal with an associated inverted subband reference signal. The output of the summer 90 is signal distortion and OOB emissions of a particular subband. The output of the summer 90 is amplified by an error or cancellation amplifier 92 to produce an error signal (ε). The error signal is inverted through an analog phase inverter 94 to provide an inverted subband error signal. The inverter subband error signals are then combined via a summer 98 to provide a broadband, combined inverted error signal. The combined inverted error signal is recombined with a delayed version of the output of the power amplifier 76 via a delay component 80 through a summer 82 to remove OOB emissions and reduce distortion levels associated with the output signal.

It is to be appreciated that subband anti-distortion signals can be employed to mitigate OOB emissions and distortion associated with an input signal. In this implementation, the subband anti-distortion signal would be inverted, summer and combined with the output of the amplifier 76 without a delay and without a comparison with an attenuated version of the output.

The present invention provides a linearization technique as well as a peak reduction system for systems that split their signals into components (e.g. EER, polar amplifier, LINC amplifiers, etc.). Feedforward, for example could not be used to linearize these types of amplifiers as there is no single signal available at the input to the power amplifier to use as a reference. The present invention provides for generation of a reference signal or an inverted version of a clean reference signal in the digital domain. The digital cross-cancellation technique can be implemented alone or combined with a predistortion technique for amplifiers using components. An optional feedback loop digitizes and channelizes a sample of the output to enable adaptive improvement of the gain and phase modifications.

Figure 5:
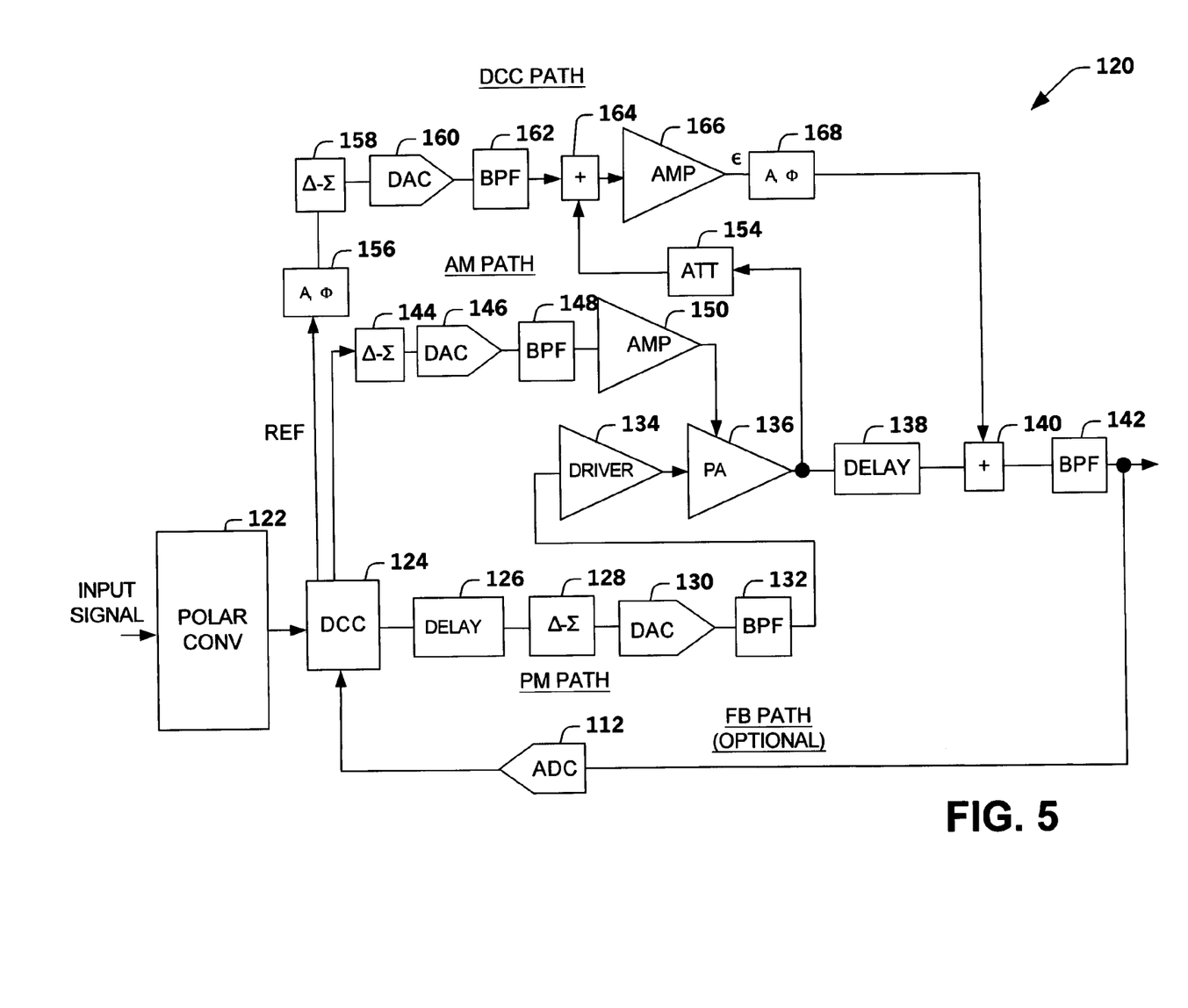
FIG. 5 illustrates a schematic block diagram of a polar amplifier system that employs a digital cross-cancellation technique in accordance with an aspect of the present invention.

FIG. 5 illustrates a polar amplifier system 120 that employs a digital cross-cancellation technique in accordance with an aspect of the present invention. The polar amplifier system 120 includes a polar converter that transforms an input signal into a polar representation of the input signal. The input signal is typically a phase and/or amplitude modulated signal which can be represented in polar form by the following equation:

$$A(t)COS(\omega_c(t)+\Phi(t))$$

where $A(t)$ is the amplitude modulated component and $COS(\omega_c(t)+\Phi(t))$ is the phase modulated component, $\Phi(t)$ is the phase component and $\omega_c(t)$ is the carrier frequency. The input signal can be in a variety of different amplitude and/or phase modulated forms. It is to be appreciated that equation above illustrates a polar representation of a single carrier input signal, where the actual signal can be a multi-carrier signal.

For example, the signal can be a signal that conforms to WCDMA, multi-carrier GSM, OFDM or other signals having similar signatures with high peak-to-average average ratios. The polar converter 122 provides the polar representation of the input signal to a digital cross cancellation component 124. Alternatively, the input signal can be provided in polar form directly to the digital cross cancellation component 124 via some device other than the polar converter 122. The digital cross-cancellation component 124 generates a first digital output signal along a phase modulated (PM) path and a second digital output signal along an amplitude modulated (AM) path. The first digital output is a constant envelope phase modulated component of the composite signal, while the second digital output is an amplitude modulated component of the composite signal.

The digital cross-cancellation component 124 can add or remove signals to the first and second digital outputs to improve the performance of the amplifier system 120. For example, the digital cross-cancellation component 124 can remove peaks associated with the composite input signal and/or the amplitude modulated component of the composite signal, for example, by clipping and/or adding anti-peak signals to the signals. Additionally, the digital cross-cancellation component 124 can perform pre-distortion of the composite input signal and/or the phase and amplitude modulated components of the composite input signal. Alternatively, pre-distortion can be performed prior to peak removal or other distortion mitigating techniques.

The digital cross-cancellation component 124 also generates a third digital output signal that is a digital reference signal (REF) associated with the desired output prior to any modification of the first digital output signal and the second digital output signal. It is to be appreciated that clean reference signal can be a representation of the desired output signal or an inverted representation of the desired output signal.

The first digital output signal is transmitted to a delta-sigma modulator 128 through a delay component 126. The delay component 126 facilitates synchronization of the phase modulated component and amplitude modulated component, in addition to facilitating cross-cancellation of the final output signal. The delta sigma modulator 128 is coupled to a DAC 130 (e.g., 1-bit DAC, multi-bit DAC) and a band pass filter 132. The delta-sigma modulator 128, the DAC 130 and the band pass filter 132 cooperate to perform a digital-to-analog conversion directly to radio transmission frequencies. The output of the band pass filter 132 is then provided to a driver 134, which provides additional gain to the analog input signal. The output of the driver 134 is then provided to the input terminal of the power amplifier 136 for amplification. The power amplifier 136 can be a linear amplifier (e.g., Class-A, Class-AB, Class-B) or, for some classes of input signal, it can be a non-linear type amplifier (e.g., Class-C, Class-D, Class-E, Class-F) based on desired performance, acceptable efficiency and acceptable OOB emissions.

The second digital output is transmitted to a delta-sigma modulator 144. The delta sigma modulator 144 is coupled to a DAC 146 (e.g., 1-bit DAC, multi-bit DAC) and a band pass filter 148. The delta-sigma modulator 144, the DAC 146 and the band pass filter 148 cooperate to perform a digital-to-analog conversion The output of the band pass filter 148 is then provided to a modulation amplifier 150 (e.g., Class-S, Class-G). The output of the modulation amplifier 150 is coupled to the supply terminal of the power amplifier 150 to provide the desired amplitude supply modulation.

The digital cross-cancellation component 124 provides the third digital signal along a DCC path to a digital phase inverter 156. The third digital signal is a reference version (REF) of the input signal corresponding to the desired amplified output signal prior to any modifications or splitting into AM and PM components. Alternatively, the digital inverter 156 can be eliminated and the inverted version of the clean reference signal can be provided by the digital cross-cancellation component 124. The inverted clean reference signal is transmitted to a delta-sigma modulator 158. The delta sigma modulator 158 is coupled to a DAC 160 (e.g., 1-bit DAC, multi-bit DAC) and a band pass filter 162. The delta-sigma modulator 158, the DAC 160 and the band pass filter 162 cooperate to perform a digital-to-analog conversion directly to radio transmission frequencies of the inverted version of the reference signal (REF).

A small portion of the power amplifier output is split off through an attenuator 154 and summed with the inverted clean reference signal through a summer or coupler 164. The output of the summer 164 is signal distortion and OOB emissions. The output of the summer 164 is amplified by an error amplifier 166 to produce an error signal (ε). The error signal is phase inverted through an inverter 168 to provide an inverted error signal. The inverted error signal is recombined with a delayed version of the output of the power amplifier 150 via a delay component 138 through a summer or coupler 140 to remove OOB emissions and reduce distortion levels. The output of the summer 140 is then provided to an optional band pass filter 142 that filters out any remaining unwanted signals outside the desired transmission band.

The digital cross-cancellation technique in accordance with an aspect of the present invention can supply correction for amplifier distortions, emissions resulting from imperfect synchronization of the AM and PM paths, finite bandwidth effects in either path, and it can correct spectral splatter that occurs from intentional clipping of the wanted signals performed to allow for amplifier size reduction (e.g., amplifiers in the AM and PM paths are sized to according to the peak signals). Additionally, since a digital reference signal is employed to determine the desired correction at the output, any modification of the signal can be corrected at the final output stage without the need for additional correction information during the amplification process.

Optionally, a feedback loop through a feedback (FB) path can be provided to sample the output of the bandpass filter 142 of the combined signals, down convert (if needed), and digitize (e.g., with a wideband ADC 112) to examine the entire output transmission band. This optional feedback loop can be employed in the amplification systems illustrated in FIGS. 1–4. The digital cross-cancellation technique of the present invention can be employed in other amplifier types such as an envelope tracking amplifier, Doherty amplifier or a LINC amplifier.

Figure 6:
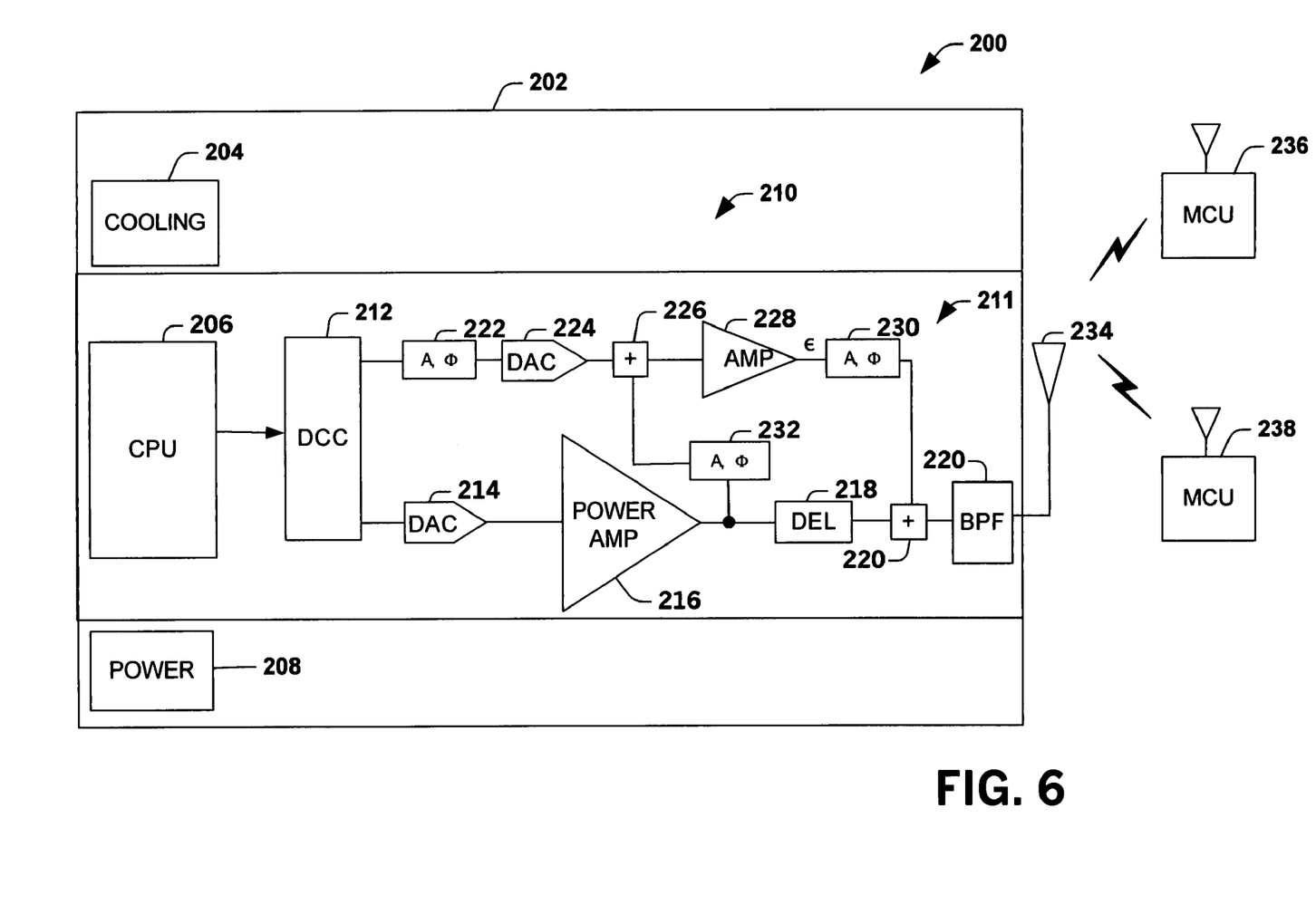
FIG. 6 illustrates a block diagram of a communication system in accordance with an aspect of the present invention.

The amplification system of the present invention can be employed in a number of applications. The amplification system can be employed in wireless transmitter applications for base stations (e.g., satellites, cellular), handsets, and other mobile communication devices. FIG. 6 illustrates a communication system 200 having a base station 202 with a transmitter 210 employing an amplifier system 211 in accordance with an aspect of the present invention. The base station 202 employs a central processing unit (CPU) to operate the base station 202 and provide an input signal to the amplifier system 211. For example, the CPU 206 can generate the type of signal (e.g., WCDMA, GSM, OFDM) to be transmitted. The base station 202 communicates to a group of mobile communication unit (MCUs) comprised of MCUs 236 and 238. The MCUs 236 and 238 are for illustrative purposes and it should be appreciated that the group of MCUs can include a greater number of MCUs based on the number of carriers in the output signal.

The base station 202 also includes cooling devices 204 and power devices 208. The power devices 208 can include AC-DC conversion and battery backup devices that protect the base station 202 from power loss failures. The power devices 208 and cooling devices 204 can be substantially reduced in size and cost compared to conventional devices since the amplifier system 211 of the present invention operates with substantially more efficiently than conventional amplifier systems. Although the base station 202 is illustrated as having a single transmitter 210, the base station 202 can have a plurality of transmitters communicating to different respective groups of MCUs over similar communication signal standards or different communication signal standards. Additionally, the MCUs 236 and 238 can also include transmitters with amplifier systems that operate in a linear mode and polar mode similar to that described for the transmitter 210.

The amplifier system 211 includes a digital cross cancellation component 212 that receives an input signal from the CPU 206 and generates a modified input signal to a first DAC 214, and a clean reference signal to a second DAC 224 through a digital phase inverter 222. The modified input signal is converted from the digital to analog domain and provided to a power amplifier 216, and the inverted clean reference signal is converted from the digital to analog domain. A small portion of the power amplifier output is split off through an attenuator 232 and summed with the inverted clean reference signal through a summer or coupler 226. The output of the summer 226 is amplified by an error or cancellation amplifier 228 to produce an error signal (ε).

The error signal is inverted through an analog phase inverter 230 to provide an inverted error signal. The inverted error signal is recombined with a delayed version of the output of the power amplifier 216 via a delay component 218. The inverted error signal and the delayed version of the output of the power amplifier 218 is combined through a summer 220 to remove OOB emissions and reduce distortion levels associated with the subband signal. The output of the summer 220 is then provided to an optional band pass filter 220 which filters out any remaining unwanted signals outside the desired transmission band. The output of the band pass filter is then transmitted across a communication link via an antenna 234.

Figure 7:
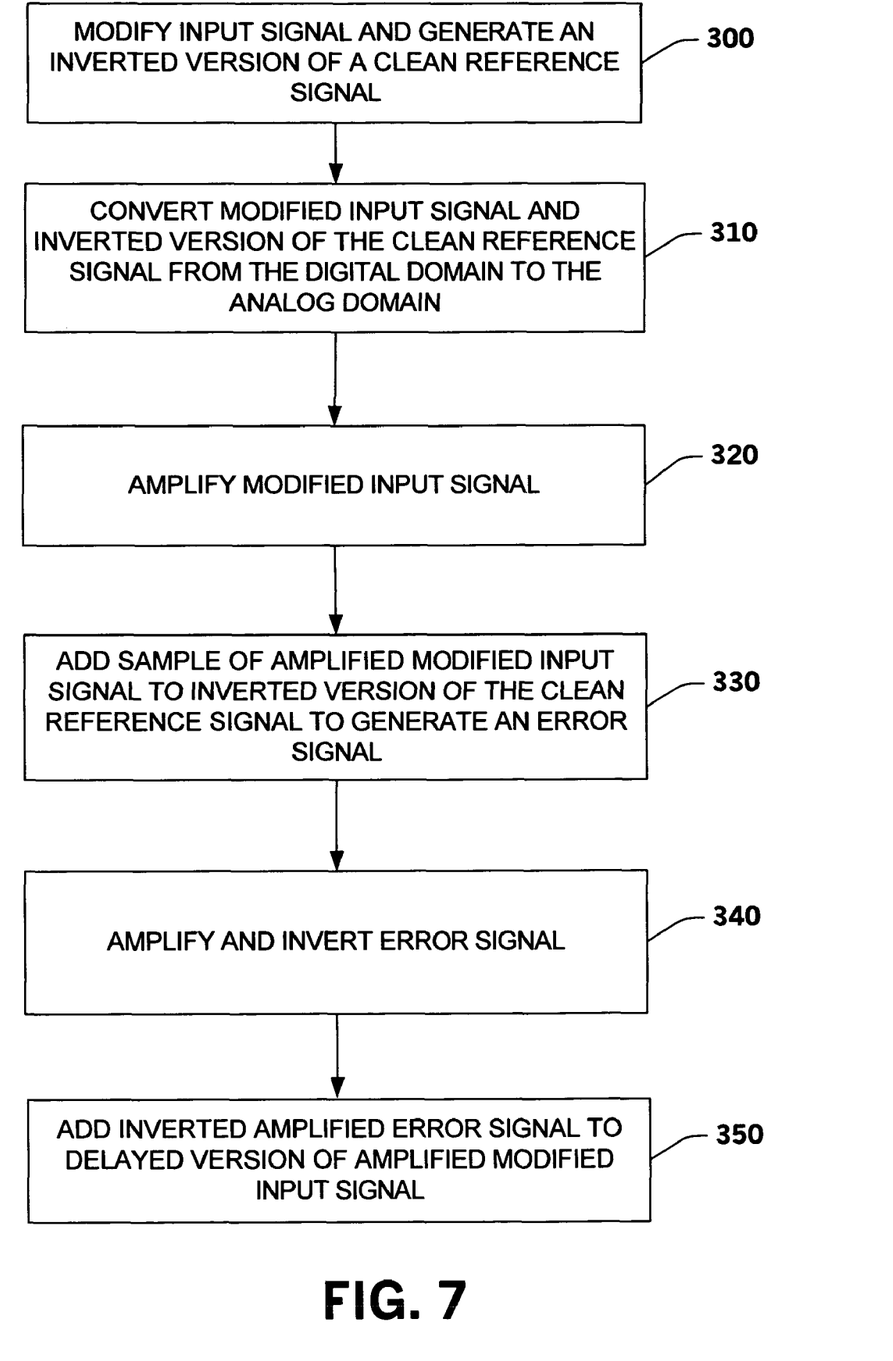
FIG. 7 illustrates a methodology for operating an amplification system employing a digital cross cancellation technique in accordance with an aspect of the present invention.
Figure 8:
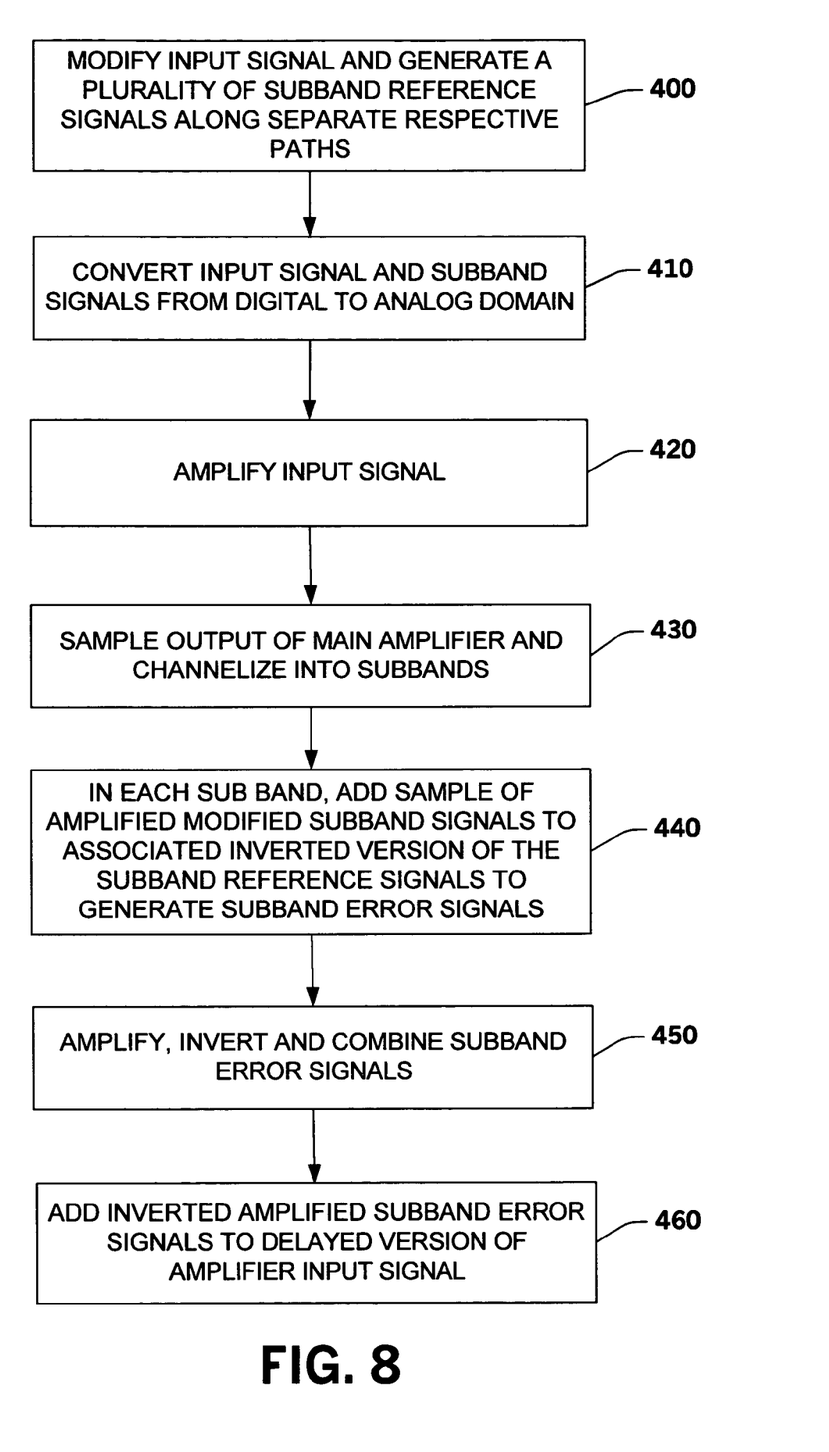
FIG. 8 illustrates a methodology for operating an amplification system employing a digital cross cancellation technique in accordance with an aspect of the present invention.

In view of the foregoing structural and functional features described above, methodologies in accordance with various aspects of the present invention will be better appreciated with reference to FIGS. 7–8. While, for purposes of simplicity of explanation, the methodologies of FIGS. 7–8 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 7 illustrates a methodology for operating an amplification system employing a digital cross cancellation technique in accordance with an aspect of the present invention. The digital cross-cancellation technique provides a digital reference to a separate DAC generating a "clean" version of the wanted signal. The clean version of the wanted signal is inverted and combined with an attenuated version of the actual output signal from the power amplifier to determine the unwanted portion of the output signal. The unwanted portion of the input signal is then inverted, amplified, and combined with a delayed version of the output of the power amplifier to cancel the unwanted portion from the output signal.

The methodology begins at 300 where an input signal is modified, for example, by clipping peak signals, adding signals (e.g., anti-peaking signals) to the input signal, performing pre-distortion or post-distortion on the input signal or other peak-to-average reduction techniques on the input signal. At about the same time period, a clean reference signal is generated corresponding to the desired wanted output signal prior to any modifications of the input signal. At 310, the modified input signal and an inverted version of the reference signal are converted from the digital domain to the analog domain via respective DACs. The modified input signal is then amplified, for example, via a power amplifier at 320. The methodology then proceeds to 330.

At 330, a sample of the amplified modified input signal is added to an inverted version of the clean reference signal to generate an error signal. The error signal corresponds to OOB emissions and signal distortion. The error signal is then amplified and inverted at 340. At 350, the inverted amplified error signal is added or mixed with a delayed version of the amplified modified input signal to generate an amplified output signal substantially free of OOB emissions and signal distortion.

FIG. 8 illustrates another methodology for operating an amplification system employing a digital cross cancellation technique in accordance with an aspect of the present invention. The methodology begins at 400 where an input signal is modified and a plurality of subband reference signals are generated along separate respective paths. The input signal is modifed by clipping peak signals, adding signals (e.g., anti-peaking signals) to the input signal, performing pre-distortion or post-distortion on the input signal or other peak-to-average reduction techniques on the input signal. At about the same time period, clean reference signals associated with each subband are generated corresponding to the desired wanted subband output signals. The modified subband signals and inverted versions of the associated reference signals are converted from the digital domain to the analog domain via respective DACs at 410. The modified input signal is then amplified, for example, via a power amplifier at 420. The methodology then proceeds to 430.

At 430, a sample of the amplified modified signal is channelized to provide a plurality of subband output signals. At 440, a sample of the modified subband signals and associated inverted version of the subband reference signals are added in each subband signal to generate subband error signals. The subband error signals corresponds to OOB emissions and signal distortion for the associated subband. The subband error signals are then amplified, inverted and combined at 450. At 460, the inverted amplified and combined error signals are added or mixed with a delayed version of the associated amplified modified output signal to generate an amplified output signal substantially free of OOB emissions and signal distortion.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

The invention claimed is:

1. An amplification system comprising:
   a power amplifier that provides an amplified output signal associated with an input signal; and
   a cross cancellation component that generates a digital reference signal that is an undistorted version of a desired output signal, the digital reference signal being converted to an analog signal, amplified and employed to determine an error signal that is added to the amplifier output signal to substantially reduced unwanted signals, distortion and out-of-band (OOB) emissions associated with the amplified output signal.

2. The system of claim 1, the error signal is determined based on a comparison of the reference signal to the amplified output signal, and a summer that sums an inverted version of the error signal with a delayed version of the amplified output signal to provide an amplified output signal substantially free of unwanted signals, distortion and out-of-band (OOB) emissions.

3. The system of claim 1, the cross cancellation component generates a pre-computed digital signal that is converted to an analog signal, amplified and added to the amplified output signal to provide an amplified output signal substantially free of unwanted signals, distortion, and out-of-band (OOB) emissions.

4. The system of claim 1, the input signal being modified to mitigate peak signals associated with the input signal prior to amplification by the power amplifier.

5. The system of claim 4, the modification being performed by at least one of a clipping component, a filter and adding at least one signal to the input signal.

6. The system of claim 1, further comprising a predistortion component that performs predistortion on the input signal.

7. The system of claim 1, further comprising a first digital-to-analog converter (DAC) that converts the input signal from the digital domain to the analog domain to provide an analog input signal to the power amplifier, and a second DAC that has dynamic range and bandwidth properties decoupled from the first DAC, that converts the inverted version of the reference signal from the digital domain to the analog domain to provide an inverted version of an analog reference signal.

8. The system of claim 7, at least one of the first and second DACs being delta-sigma DACs, such that the at least one of the input signal and the inverted version of the reference signal are converted into the analog domain directly at a desired radio transmission frequency.

9. The system of claim 1, further comprising a coupler that combines an inverted version of the reference signal with at least a portion of the amplified output signal to generate the error signal.

10. The system of claim 1, further comprising a cancellation amplifier associated with amplification of the error signal.

11. The system of claim 1, further comprising:
   a channelizer that separates a sample of the output of the amplifier into a plurality of subband output signals;
   the reference signal comprising a plurality of subband reference signals compared with the corresponding plurality of subband output signals to generate a plurality of subband error signals; and
   a combiner that combines the plurality of subband error signals to provide a combined error signal that is combined with the amplifier output signal to substantially reduce distortion and OOB emissions.

12. The system of claim 1, the amplification system being one of a polar amplifier, a Linear Amplification with Nonlinear Components (LINC) amplifier, an envelope tracking amplifier and a Doherty amplifier.

13. The system of claim 1, further comprising a feedback path having an analog-to-digital converter (ADC) that converts the final output signal from the analog domain to the digital domain to provide a final digital output signal to the cross cancellation component.

14. The system of claim 1, wherein the digital reference signal corresponds to a desired output signal.

15. The system of claim 1, further comprising a feedback path to synchronize amplitude and phase in at least one separate path associated with converting, amplifying and adding the digital reference signal to the amplifier output signal.

16. A transmitter comprising the amplification system of claim 1.

17. A base station comprising the transmitter of claim 16.

18. An amplification system comprising:
   a digital cross cancellation component that generates a reference signal associated with a digital input signal;
   a modification component that modifies the digital input signal to mitigate peak signals of the digital input signal and provide a modified input signal;
   an input path associated with amplification of the modified input signal to provide an amplified output signal;
   a reference path associated with generating an error signal by combining an inverted version of the reference signal with an attenuated version of the amplified output signal; and
   a coupler that combines an inverted version of the error signal with a delayed version of the analog output signal to generate a final output signal substantially free of out-of-band (OOB) emissions and signal distortion.

19. The system of claim 18, the input path comprising a first digital-to-analog converter (DAC) coupled to an input terminal of a power amplifier and the reference path comprising a second DAC coupled to an input terminal of a cancellation amplifier through a second coupler, the second coupler also being connected to an output terminal of the power amplifier through an attenuator.

20. The system of claim 18, further comprising:
   a channelizer for providing a plurality of subband output signals from a sample of the amplifier output signal; and
   a plurality of additional reference paths such that each of the plurality of subband output signals has an associated reference path to determine a subband error signal associated with a subband output signal to correct signal distortion and OOB emissions.

21. An amplification system comprising:
   means for modifying a digital input signal;
   means for converting the modified digital input signal into a modified analog input signal;
   means for amplifying the modified analog input signal to provide an amplified output signal;
   means for adding a cancellation signal to the amplified output signal to reduce errors and out-of-band (OOB) emissions caused by the modifying of the digital input signal, the means for adding further comprising means for computing errors associated with the amplified output signal; and
   means for generating a reference signal to be converted and amplified to provide the cancellation signal to be added to the amplified output signal.

22. The system of claim 21, the means for adding further comprising
   means for generating an inverted version of a digital reference signal associated with a desired output signal;
   means for converting the inverted version of the digital reference signal into an inverted analog reference signal;
   means for combining an attenuated version of the amplified output signal with the inverted analog reference signal to generate an error signal; and
   means for combining an amplified inverted version of the error signal with a delayed version of the amplified output signal to provide a final output signal substantially free of out-of-band (OOB) emissions and signal distortion.

23. The system of claim 21, further comprising means for separating a sample of the amplifier output signal into a plurality of subbands, a plurality of means for signal distortion correction of each of the plurality of subbands and means for aggregating the plurality of corrected subbands into a combined error signal to be added to the final output signal.

24. A method of amplifying an input signal comprising:
   generating a digital reference signal that corresponds to an inverted version of a desired output signal;
   amplifying the input signal to provide an amplified output signal;
   combining an attenuated version of the amplified output signal with an analog version of the digital reference signal to generate an error signal; and
   combining an inverted, amplified version of the error signal with a delayed version of the amplified output signal to provide a final output signal substantially free of out-of-band (OOB) emissions and signal distortion.

25. The method of claim 24, further comprising modifying the input signal to mitigate peak signals associated with the input signal.

26. The method of claim 25, further comprising converting the input signal and the reference signal from the digital domain to the analog domain directly to a desired radio transmission frequency.

27. A method of amplifying an input signal comprising:
   amplifying an input signal to provide an amplified output signal;
   separating a sample of the output signal into a plurality of subband output signals;
   generating a plurality of subband reference signals;
   generating subband error signals by comparing each of the plurality of subband output signals with respective subband reference signals;
   combining the subband error signals to provide a combined error signal; and
   combining an inverted version of combined error signal with a delayed version of amplified output signal to provide an output signal substantially free of out-of-band (OOB) emissions and signal distortion.

28. The method of claim 27, further comprising modifying the input signal to mitigate peak signals associated with the input signal.

* * * * *